United States Patent [19]

Dierschke

[11] Patent Number: 5,162,887
[45] Date of Patent: Nov. 10, 1992

[54] BURIED JUNCTION PHOTODIODE

[75] Inventor: Eugene G. Dierschke, Dallas, Tex.

[73] Assignee: Texas Instruments Incorporated, Dallas, Tex.

[21] Appl. No.: 700,099

[22] Filed: May 7, 1991

Related U.S. Application Data

[63] Continuation of Ser. No. 265,195, Oct. 31, 1988, abandoned.

[51] Int. Cl.[5] ............................................. H01L 27/14
[52] U.S. Cl. .................................. 257/465; 257/463; 257/464
[58] Field of Search ............... 357/30 L, 30 D, 30 G, 357/30 I, 30 J, 30 P, 30 R, 30 PF, 19, 20; 250/211 J, 211 R

[56] References Cited

U.S. PATENT DOCUMENTS 3,996,461  12/1976  Sulzbach et al. .................. 357/30

FOREIGN PATENT DOCUMENTS

| 0017785 | 2/1983 | Japan | 357/30 I |
|---|---|---|---|
| 0096781 | 6/1984 | Japan | 357/30 P |
| 0096784 | 6/1984 | Japan | 357/19 |
| 60-241277 | 11/1985 | Japan | 357/30 P |
| 0016580 | 1/1986 | Japan | 357/30 P |
| 61-63052 | 1/1986 | Japan | 357/30 P |
| 0054682 | 3/1986 | Japan | 357/30 PF |
| 61-56456 | 3/1986 | Japan | 357/30 P |
| 61-63051 | 4/1986 | Japan | 357/30 P |
| 0185979 | 8/1986 | Japan | 357/30 |
| 62-39080 | 2/1987 | Japan | 357/30 P |
| 1-150372 | 6/1989 | Japan | 357/30 P |
| 2-294079 | 12/1990 | Japan | 357/30 P |

Primary Examiner—Rolf Hille
Assistant Examiner—Minhloan Tran
Attorney, Agent, or Firm—W. James Brady, III; B. Peter Barndt; Richard L. Donaldson

[57] ABSTRACT

A buried P-N junction photodiode is obtained in Lin-BiCMOS process with junctions formed between N+DUF diffused region and both first P-EPI layer and second P-EPI layer. Contact to N+DUF diffused region is made by a small area deep N+collector diffusion or N well diffusion. This novel buried-junction photodiode can be used for several types of unique photodetector structures including: single photodiode with low surface leakage current, multi-junction photodiodes for incident light spectral distribution information and higher efficiency visible response photodetectors. The disclosed structures are compatible with bipolar and CMOS processes for providing on-chip integration of optical photodetectors with Linear ASIC standard cells and other circuit functions.

28 Claims, 8 Drawing Sheets

| PHOTODIODES UNDER TEST | MOS TRANSISTOR SWITCHES | | | |
|---|---|---|---|---|
| | J | K | L | M |
| A | OPEN | CLOSED | CLOSED | OPEN |
| A + B | CLOSED | OPEN | CLOSED | OPEN |
| A + B + C | CLOSED | OPEN | OPEN | CLOSED |

BURIED JUNCTION PHOTODIODE

This application is a continuation of application Ser. No. 07/265,195, filed Oct. 31, 1988, now abandoned.

BACKGROUND

In silicon P-N junction photodiodes, photons of incident light penetrate the Si surface and electron-hole pairs are generated when a photon is absorbed. The light intensity decreases exponentially from the incident surface as photons are absorbed. The penetration depth into the Si is dependent on the wavelength of the incident light. The absorption length (distance for light intensity to decrease to 1/e of initial intensity at surface) varies from 3 microns at 650 nm to 25 microns at 900 nm. Any generated minority carriers (electrons in P-type material or holes in N-type material) which diffuse to and crosses P-N junction results in photodiode current signal.

A conventional silicon P-N junction photodiode is made by the formation of N-type or P-type layer on P-type or N-type substrate material, respectively, by diffusion, implantation, or epitaxial deposition. Some examples of conventional photodiodes are shown in FIGS. 1a-1f. Surface leakage current exists in all such photodiodes and is proportional to junction surface periphery.

Many photodetector applications include acquisition of information about spectral distribution of incident light or about light available in a certain wavelength range. The conventional measurement approach is to use optical filters over photodiodes. For example, Texas Instruments manufactures a photodetector for a camera. That photodetector has two adjacent conventional junction photodiodes to determine spectral distribution information about incident light for camera exposure control. However, such detectors suffer from surface junction leakage current losses, require twice the surface area of a single photodiode (and thus further surface leakage) and have an added external element (optical filter 8) that is not a part of the normal fabrication process for integrated circuits. So, it is desired to have a photodiode that can discriminate between or among different frequencies of light, one that has less surface junction leakage, one that eliminates the use of a separate, optical filter, and one capable of integration with the manufacture of other electronic circuits.

SUMMARY OF THE INVENTION

Applicant has discovered a unique structure that can overcome or reduce the foregoing problems of prior art structures. In this new structure, a buried diffusion region is used to form a P-N junction beneath the surface of the substrate. Such a buried P-N junction uses the material above the junction as an optical filter. Hence, certain frequencies of light, such as those near the blue range of visible light, are filtered out by the substrate material that is above the buried diffusion region. As such, the junction at the buried diffusion region measures a different spectrum of light from a P-N junction formed near the surface of the substrate.

In one embodiment of the invention, the buried P-N junction photodiode is combined with a surface photodiode in order to give comparative measurements of the spectral distribution of incident light. By comparing the current generated at the surface junction with the current generated at the buried junction, one can obtain a spectral analysis indicating, for example, the relative amount of incident blue light. The amount of incident blue light would be proportional to the difference between the current generated by the surface and buried junction photodiodes.

In its broader aspects, the photodiode of the invention includes a substrate of semiconductor material, such as monocrystalline silicon. Of course, other semiconductor materials such as germanium or gallium arsenide could be used. In typical fabrication, the substrate is normally provided with an epitaxial, monocrystalline layer. Within that layer, various electronic circuits may be formed, including surface photodiodes, buried photodiodes, and other elements including transistors, resistors and capacitors. In order to form some of those devices, the epitaxial layer receives a buried diffusion layer. In the preferred embodiment, the substrate is made of P type material that is heavily doped. The epitaxial layer is made of lightly doped P type material. The buried diffusion region is made of highly doped N type material and is commonly referred to as an N+ DUF region. That buried layer or region reduces the series resistance of integrated diode or transistor devices.

When light strikes the surface of the epitaxial layer, light in the blue wavelength range is absorbed within about the first micron of the surface. However, light of longer wavelength such as infrared penetrate the Si much deeper and is absorbed in region of buried layer.

A second region of N type conductivity extends from the surface of the substrate into the buried layer. While the buried layer itself occupies a relatively large rectangular or square area, the second region of N type material is a substantially smaller cross section that contacts one corner of the buried layer. Thus, the buried P-N junction between the N+ DUF layer and the P type epitaxial material has a surface contact where current can be measured. Current flows as a result of light striking the buried P-N junction region and generating electron hole pairs. This photoelectric effect is well known for silicon and other semiconductor materials. The small surface periphery of the second N region and the epitaxial layer substantially reduces the amount of surface leakage current in the device.

Surface recombination of minority carrier electrons generated by absorption of light can also be reduced by diffusing or implanting a P type impurity into a surface region of the epitaxial layer. Such a shallow P region with a concentration profile will generate an electrical field to drive minority carrier electrons away from the surface. Thus, more electrons will be available to the buried P-N junction. Such a diffusion is also consistent with other process steps for forming either the source or drain of a MOS transistor or the P base of a bipolar transistor.

The novel photodiode may also be used for a power device, such as a solar cell. The foregoing advantages of reduced leakage current and reduced carrier loss will enhance the efficiency of a solar cell.

In one embodiment, the buried junction photodiode is fabricated together with a surface photodiode. The electrical current generated by the two diodes can be compared by suitable, well known circuitry in order to measure the difference between light absorbed near the surface and light penetrating to the depth of the buried junction. An even further discrimination can be made among the incident light frequencies by adding a third or more junction diodes. These diodes can be connected or disconnected by MOS (or bipolar) transistors that can be formed during fabrication of the diodes themselves. As such, an entire spectral analytical circuit for a camera can be designed, including control circuitry for connecting and disconnecting selected junction diodes to a photodiode current monitor.

DETAILED DESCRIPTION

With reference to FIG. 2, there is shown fundamental components of a buried junction photodiode 20. A substrate 21 of semiconductor material has a doping of one type of conductivity. In the example shown, the substrate is heavily P doped and designated P+. The photodiode 20 is constructed in a P doped epitaxial layer 22 that is grown on top of substrate 21. It is well known in the semiconductor art to grow epitaxial layers in order to accommodate devices of various types of construction. Those devices could be fabricated in a substrate, but for device IC performance reasons epitaxial layers, such as layer 22 are often used. Layer 22 is subsequently patterned and otherwise implanted or diffused with impurities to form a region 23 of heavily doped material of a conductivity opposite to the conductivity of substrate 21 and layer 22. In this case, the region 23 is a heavily N doped region (N+) designated as a DUF region (diffusion under field). Then another P doped epitaxial layer 28 is grown. A surface region 27 is exposed to incident light. So, the region 23 becomes a buried layer 23 that is completely surrounded by the lightly P doped epitaxial layers 22 and 28. As such, the entire buried N+ DUF region 23 in conjunction with the surrounding epitaxial materials 22 and 28 form a buried junction photodiode. Contact to the buried layer 23 is provided by a second N region 24 formed by diffusion or implantation. The second N region 24 extends from the surface 27 to the buried layer 23. A highly doped (N+) contact region 25, together with a ohmic contact 26, provide a complete electrical connection to an outside current detector, not shown. Electrical connection to P side of P-N junction is made thru P+ region 29 formed by diffusion or implantation.

When incident light strikes the surface 27, photons penetrate the material and generate electron-hole pairs when the photons are absorbed. Any minority carrier which crosses P-N junction generates a photodiode current. In photoconductive operation, the device 20 is reverse biased. To operate photovoltaically, no bias is required. In either case, the P EPI region is exposed to light. Photons of energy are absorbed and generate electron-hole pairs. Short, medium and long wavelengths of photon power are absorbed at different depths. Shorter wavelengths are absorbed near the surface; longer wavelengths penetrate deep into the structure. The heavily doped surface diffusion or implanted layer required to form the conventional P-N junction photodiode results in increased surface-state densities (and thereby higher surface recombination velocity) and in a low lifetime surface layer. The advantage of new photodiode 20 without surface layer is to reduce the number of carriers which are lost by surface recombination and by recombination in a low lifetime surface layer. This is especially important for UV wavelengths (shorter than visible wavelength) with sub-micron absorption lengths.

The photodiode 20 has significant advantages over the prior art devices shown in FIG. 1. In all of those devices, there is a relatively large area on the surface of the photodiode where the N and P regions meet. For example, in FIGS. 1a, 1b, the outer annular P region 2 encloses the rectangular N region 3 and the entire linear periphery of the P-N junction appears on the surface of device FIG. 1a, 1b. Given the large junction periphery of P-N junction at the surface, there can be a substantial surface leakage current.

In sharp contrast, the inventive diode of FIG. 2 has a relatively small surface junction periphery. This small periphery is defined by the intersection of the second N region 24 with the surface 27 of the P EPI material 22. It is desirable to have the linear surface junction as small as possible. In the device of FIG. 2, the linear surface junction is less than 10% of the perimeter of the DUF region 23.

One of the problems solved by the invention is the ability of the inventive photodiode 20 to be integrated into a standard circuit manufacturing process. As such, the buried layer 23 also forms a normal part of any bipolar transistor manufactured with typical bipolar process technology. Also, the second N region 24 that brings the buried junction into contact with the surface 27 is also readily adaptable to either bipolar or MOS transistor fabrication. The N doping to form region 24 can be accomplished during fabrication of either a deep N+ collector in a bipolar transistor or the N well in a MOS transistor.

Another advantage of the structure of photodiode 20 is that a nitride protective overcoat can be placed over the junction surface periphery of the second N region 24 for passivation and removed over most of the remaining area of surface 27 in order to optimize photodiode radiant response, such as by deposition of an antireflection coating. Response time of the photodiode varies as the square of the thickness of the photodiode carrier collection region. In the buried junction photodiode 20, response time is improved because the buried layer region 23 is closer to the middle of the lightly doped P epitaxial layers 22 and 28, thus reducing the effective thickness of the collection region.

Another buried junction photodiode 30 is shown in FIG. 3. That diode is similar to the basic buried junction photodiode 20 of FIG. 2, except a P region 31 is formed near the light receiving surface 27. The P region 31 may be deposited during the formation of a source or drain of a CMOS device or a base of a bipolar device or by a separate optimized deposition. The purpose of region 31 is to further reduce the effect of surface recombination of carriers generated by light absorption. Without the P region 31, minority carriers generated near the surface in the upper regions of epitaxial layer 28 can recombine at the surface 27. A shallow P region 31 with a proper doping concentration profile (FIG. 3) will generate a built in electric field. That field will drive minority carrier electrons away from the surface 27. The effect would be a higher photodiode radiant responsivity, especially for visible wavelengths which are absorbed within a few microns of the surface 27. The minority carrier lifetime and diffusion length in the lightly doped epitaxial region 28 are sufficiently long so that most of the electrons will be collected by the junction between the epitaxial region 28 and the DUF region 23.

The N+ buried layer 23 in FIGS. 2 and 3 can also be multiple stripes 23' interconnected at one end instead of a single rectangular area. See FIGS. 2e and 3e. The purpose would be to decrease junction capacitance and bulk junction current leakage. Because of relatively long minority carrier diffusion lengths in silicon, the radiant responsivity would decrease only slightly by optimum choice of spacing of stripes.

Figure 1A:
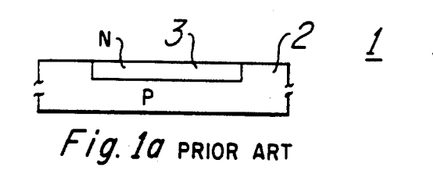
FIGS. 1a-1f show three examples of the cross section and surface geometries of prior art photodiodes.
Figure 1B:
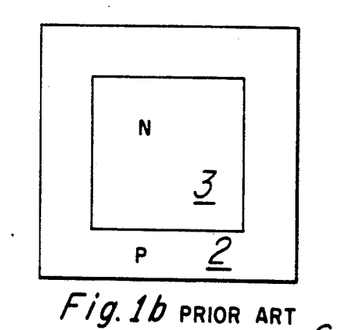
Figure 1C:
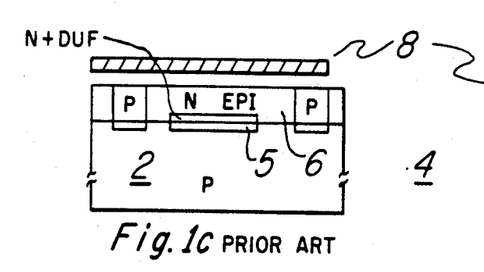
Figure 1D:
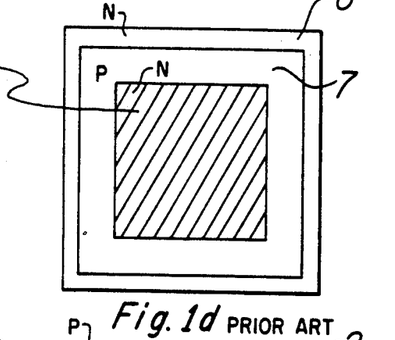
Figure 1E:
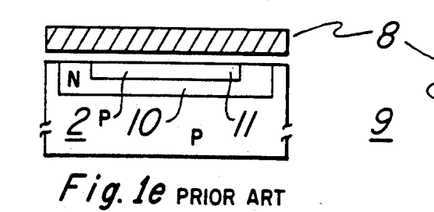
Figure 1F:
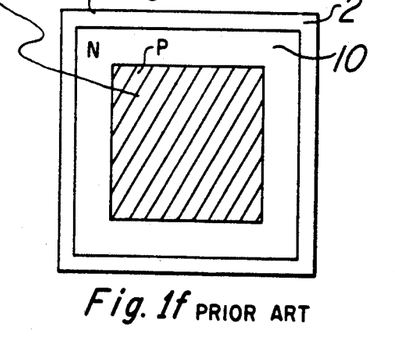
Figure 2A:
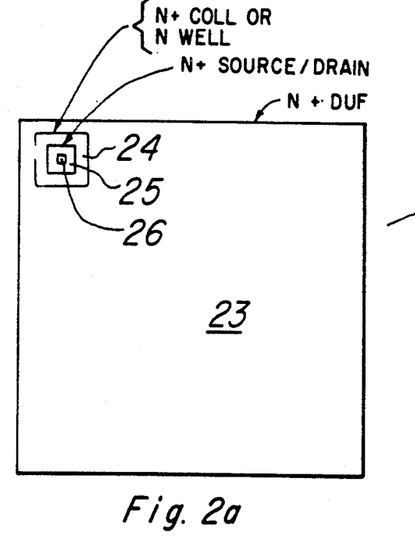
FIGS. 2a-2e show respectively planar views of the photodiode of the invention, the electrical schematic of the invention in a substrate, a cross sectional view of the planar view of FIG. 2a and the doping profile of the regions in the photodiode.
Figure 2B:
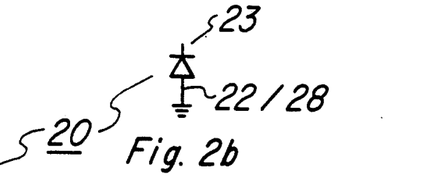
Figure 2C:
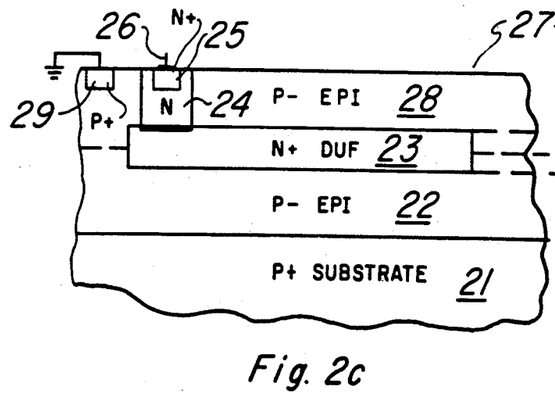
Figure 2D:
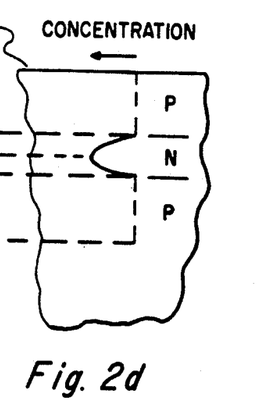
Figure 2E:
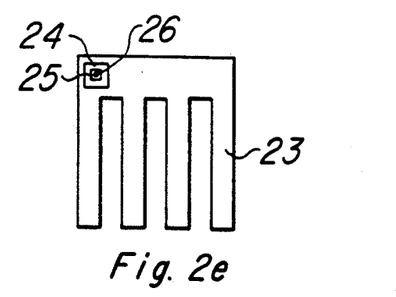
Figure 3A:
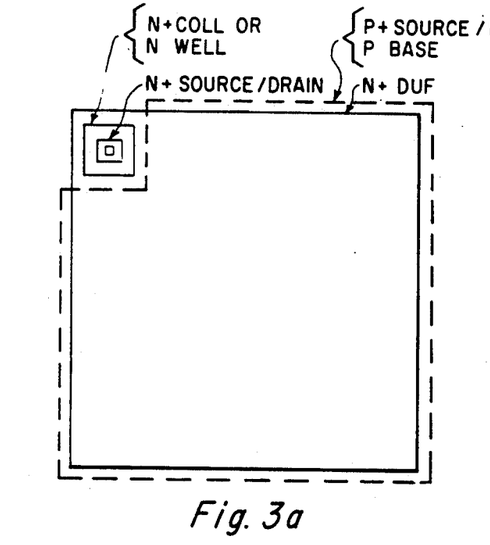
FIGS. 3a-3e are similar to FIG. 2 and further show a more heavily doped surface P region.
Figure 3B:
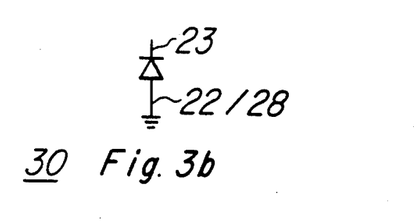
Figure 3C:
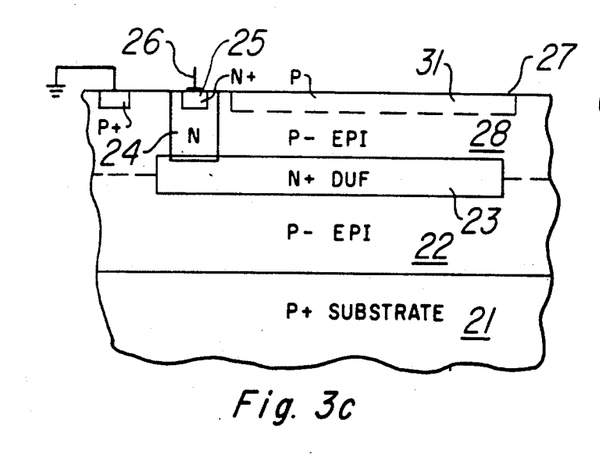
Figure 3D:
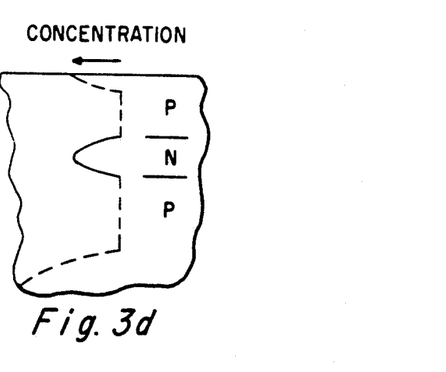
Figure 3E:
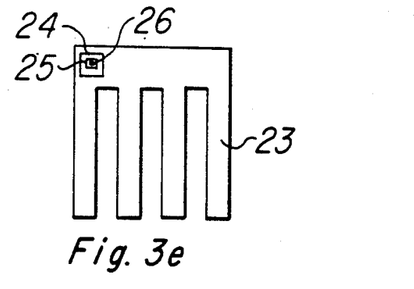
Figure 4A:
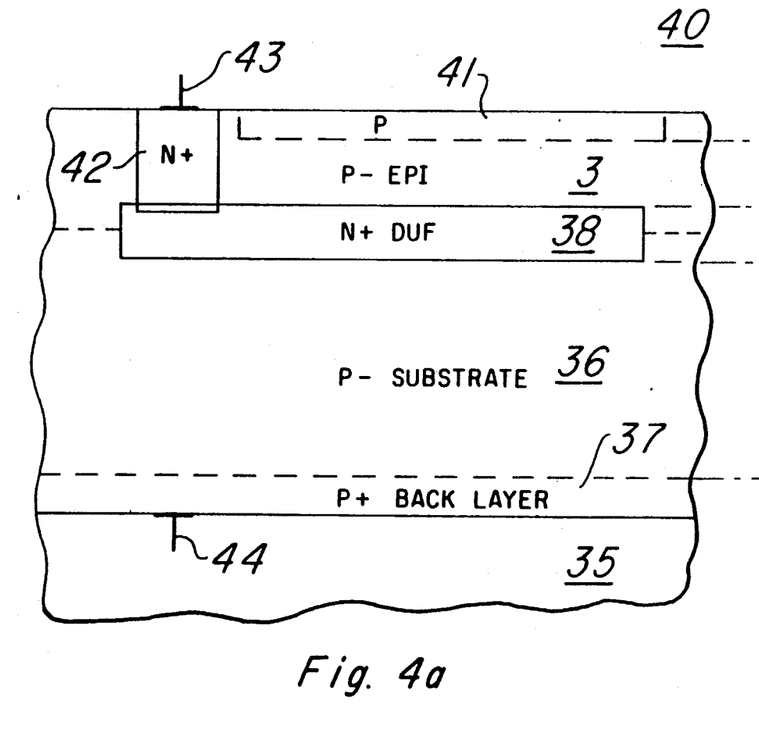
FIGS. 4a, 4b show a cross sectional area of a solar cell and the concentration of doped regions in such a cell.
Figure 4B:
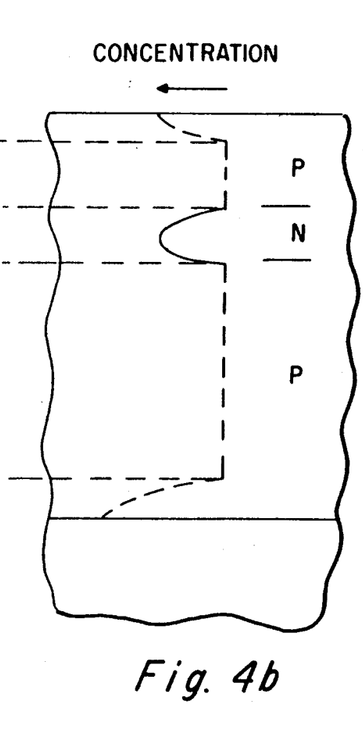

The particular structure of the photodiode shown in FIG. 3 can also be applied to solar cell applications as shown by the structure in FIG. 4. A conventional solar cell has a thin P layer on an N substrate or a thin N layer on a P substrate, such as the structure shown in FIGS. 1a, 1b. In such devices, there is a trade-off between the very thin low concentration surface layer needed to reduce surface recombination for visible wavelengths and a countervailing need for relatively thick, high concentration layer for low sheet resistivity to minimize series resistance. The structure 40 shown in FIG. 4 would optimize the surface layer concentration profile to minimize surface recombination and would use the low sheet resistivity N+ DUF region 38 for current flow. Note the heavily P doped back layer 37 and the second, backcontact 44. The electric field generated by the concentration profile of layer 37 minimizes surface recombination of carriers at back surface.

One of the advantages of the buried junction diode 20 is its ability to be combined with other diodes in order to provide comparative current readings and thus compare light spectra incident upon a surface. Such a dual photodiode is illustrated by the structure 50 shown in FIGS. 5a–5d. This structure is similar to the basic structure shown in FIG. 2 except a N region 51 is provided on the surface 27. The region 51 may be formed during creation of a source or drain in a CMOS device or an emitter in a bipolar device or a separate optimized deposition.

The purpose of the region 51 is to form two P-N junction photodiodes, one above the other. The first junction photodiode is formed by the junction of region 51 with the underlying P epitaxial region 28. The other photodiode is the previously discussed junction between P type regions 22 and 28 and N type buried layer 23. A ohmic contact 52 is provided on the surface N region 51 in order to create the dual diode structure illustrated schematically in FIG. 5b. The two photodiodes can be electrically accessed independently, a major advantage over conventional approaches.

Figures 5A, 5B:
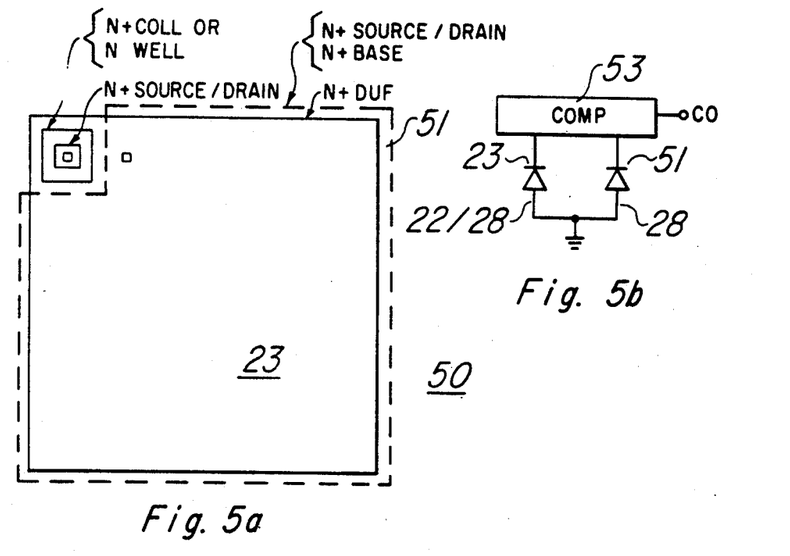
FIGS. 5a-5d show a dual, surface and buried junction photodiode structure.
Figure 5C:
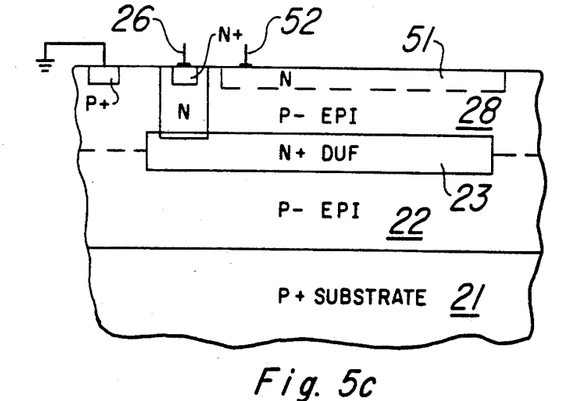
Figure 5D:
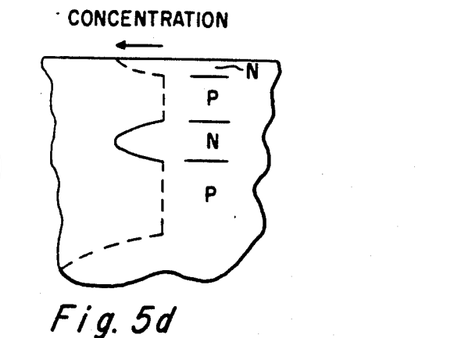
Figure 6:
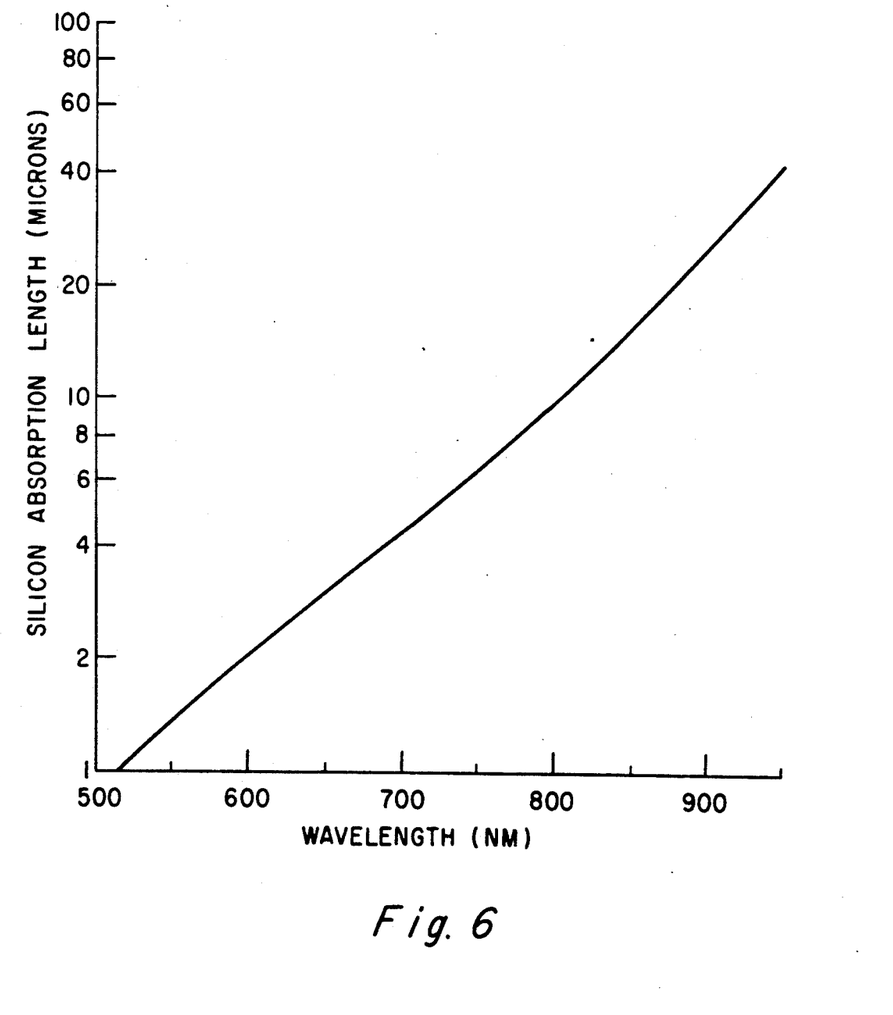
FIG. 6 is a graphical depiction of the approximately exponential relationship between the depth of absorption in silicon and the wavelength of incident light.

The absorption length of light in silicon depends upon the wavelength as shown in FIG. 6 with typical values of 25 microns for 900 nanometers infrared wavelength and 3 microns for 650 nanometers red visible wavelength. The two photodiodes of structure 50 in FIG. 5 can be used to obtain information about the spectral distribution of incident light. The lower P-N junction formed by regions 22 and 28 and region 23 have peak responses in the infrared wavelength range. The top P-N junction photodiode formed by regions 28 and 51 will have peak response at shorter wavelengths in or near the visible wavelength range. Alternately the structure could be modified to electrically short the top junction, thus using the region strictly as an integrated optical filter.

Figures 7A, 7B:
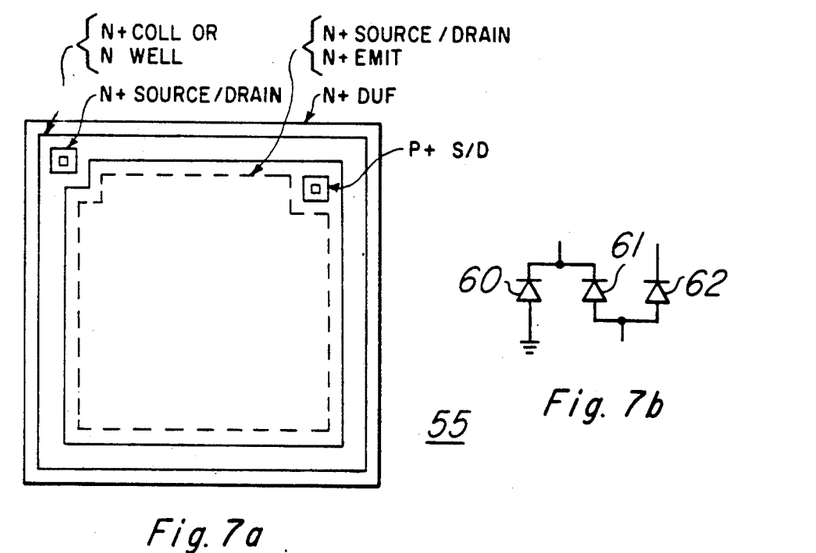
FIGS. 7a-7d shows a three photodiode configuration of the invention.
Figure 7C:
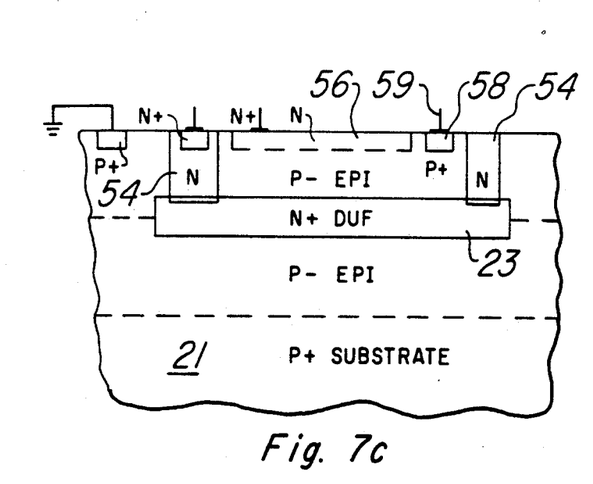
Figure 7D:
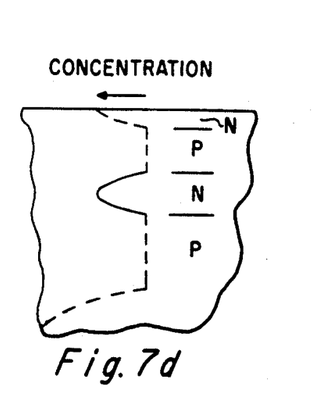
Figure 8A:
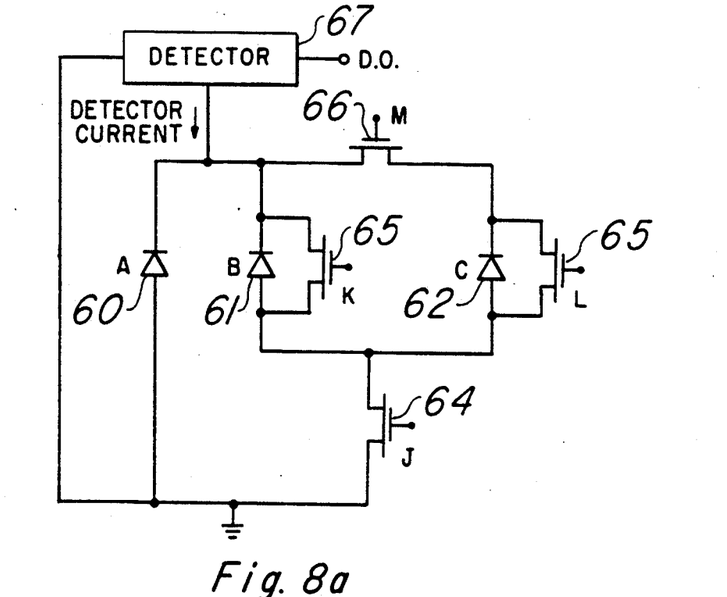
FIGS. 8a, 8b show an electrical schematic of a three photodiode device combined with switching transistors and a typical test pattern for interconnecting the various diodes.
Figure 8B:
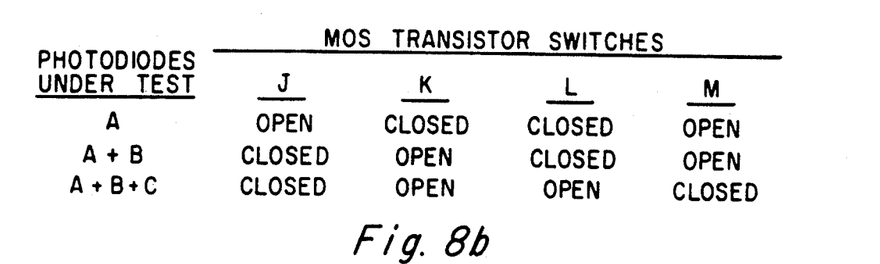

Still another photodiode structure incorporating three photodiodes is shown in FIG. 7. The three diode structure 55 of FIG. 7 is similar to the structure 50 of FIG. 5, except the deep N region 54 used to contact the N DUF layer 22 is changed to a continuous ring 54 near the edge of the DUF region 23. The use of ring region 54 enables the formation of three P-N photodiodes. The structure 55 can be used to determine the spectral distribution of incident light in greater detail. The response of different photodiodes cannot be measured simultaneously. However, with the use of MOS transistor switches, as shown in FIG. 8, the response of various photodiode combinations can be measured. See FIG. 8b. Such data can then be analyzed to determine the response of each photodiode. Alternatively, the structure could be modified to electrically short the top one or two junctions, thus using the regions strictly as integrated optical filters.

Figure 9:
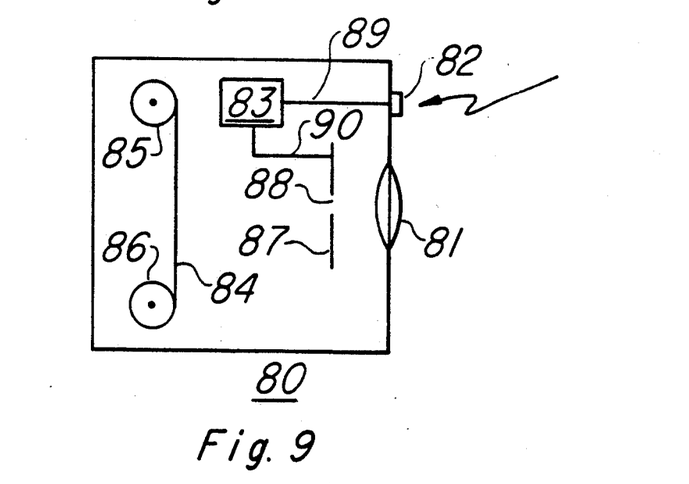
FIG. 9 shows a camera incorporating a photodiode described in this invention.

Turning to FIG. 9, there is shown a camera 80 including a photodetector 82 selected from the group of photodiodes or detectors described above, preferably the photodiode 50 of FIG. 5. Camera 80 includes a lens 81 and a shutter 87 with a variable size opening 88. A photosensitive film 84 receives light passing shutter 87. The film 84 can be advanced from a supply roll 85 to a take-up roll 86. A shutter control mechanism 83 receives the detected photodiode current of photodetector 82 via line 89. Such shutter control mechanisms are well-known in the art. In response to the received photodiode current, shutter control 83 will vary the opening 88 of shutter 87 via suitable actuating means 90. The actuating means 90 may include electrical, electronic, mechanical or other actuating means known to those skilled in the art of making cameras.

In summary, the applicants have disclosed a buried junction photodiode that is compatible with Bipolar, MOS, and BiCMOS (combined Bipolar and CMOS) planar device fabrication. The disclosed structures reduce the peripheral area of the surface P-N junction, thereby reducing surface leakage currents, and reduces surface recombination, thereby increasing efficiency especially for visible and UV wavelengths. The use of vertically stacked multiple photodiode junctions can give spectral distribution information about incident light. The structures of the invention can be fabricated in silicon or other photoelectric materials including but not limited to germanium, gallium-arsenide, zinc sulfide, indium phosphide, gallium-aluminum arsenide, cadmium sulfide, cadmium selenium, lead sulfide, lead telluride, lead selenide, indium antimony and other photoelectric compounds of elements selected from groups IIB, IIIA, IVA and VA of the periodic table of elements.

What is claimed is:

1. A photodiode electrically responsive to incident light comprising:
   a first region of semiconductor material of a first conductivity type;
   a second region of semiconductor material of a second conductivity type opposite said first conductivity type extending over a portion of said first region;
   a third region of semiconductor material of said first conductivity type extending over and contacting at least portions of said first and second regions, said third region for receiving light, and
   a fourth region of the second type conductivity extending from the second region through said third region and connected to a first electrical contact, and a second electrical contact connected to said third region.

2. The photodiode of claim 1 wherein the first, second, and third regions comprise a photoconductive material selected from the group consisting of Si, Ge, ZnS, CdS, CdSe, GaAs, PbS, PbTe, InSb, InP, GaAlAs, AlAs, and PbSe.

3. The photodiode of claim 1 wherein the first region comprises a first epitaxial layer of monocrystalline material and the third region comprises a second epitaxial layer of monocrystalline material.

4. The photodiode of claim 1 wherein the second region comprises interconnected multiple stripes.

5. The photodiode of claim 1 wherein the fourth region has an outer periphery which is smaller than an outer periphery of the second region.

6. The photodiode of claim 1 further comprising a substrate of the first conductivity type, said first region extending over said substrate, said substrate having a conductivity greater than said first and third regions.

7. The photodiode of claim 1 in which the first conductivity type is p type and the second conductivity type is n type.

8. The photodiode of claim 1 in which said first and third regions are lightly doped and said second region is heavily doped.

9. The photodiode of claim 1 further comprising a surface region of semiconductor material of said second conductivity type extending over a portion of said third region, said surface region for receiving light.

10. The photodiode of claim 9 further comprising a third electrical contact connected to said surface region.

11. The photodiode of claim 1 in which said third region has a surface for receiving light, a portion of said light receiving surface having a conductivity of the first type greater than the remainder of said third region.

12. A photodiode electrically responsive to incident light comprising:
    a first region of semiconductor material of a first conductivity type;
    a second region of semiconductor material of a second conductivity type opposite said first conductivity type extending over a portion of said first region;
    a third region of semiconductor material of said first conductivity type extending over and contacting at least portions of said first and second regions, said third region having a surface for receiving light;
    a portion of said light receiving surface having a conductivity of the first type greater than the remainder of said third region.

13. A photodiode solar cell electrically responsive to incident light comprising:
    a first region of semiconductor material of a first conductivity type, said first region having a back surface of semiconductor material of said first conductivity type;
    a second region of semiconductor material of a second conductivity type opposite said first conductivity type extending over a portion of said first region; and
    a third region of semiconductor material of said first conductivity type extending over and contacting at least portions of said first and second regions, said third region having a front surface of semiconductor material of said first conductivity type for receiving light, a portion of said front surface having a conductivity greater than the conductivity of semiconductor material of the first type disposed between said portion of the front surface and said back surface, said back surface having a conductivity greater than the conductivity of said portion of the front surface.

14. The photodiode solar cell of claim 13 wherein the fourth region has an outer periphery which is smaller than an outer periphery of the second region.

15. The photodiode solar cell of claim 13 wherein the first, second, and third regions comprise a photoconductive material selected from the group consisting of Si, Ge, ZnS, CdS, CdSe, GaAs, PbS, PbTe, InSb, and PbSe.

16. The photodiode solar cell of claim 13 wherein the second region comprises interconnected multiple stripes.

17. The photodiode solar cell of claim 13 further comprising a fourth region of the second conductivity type extending from the second region through said third region and connected to a first electrical contact adjacent said front surface for receiving light.

18. The photodiode solar cell of claim 13 in which the first conductivity type is p type and the second conductivity type is n type.

19. The photodiode solar cell of claim 13 in which the first region comprises a substrate of monocrystalline material and said third region comprises an epitaxial layer of monocrystalline material.

20. The photodiode solar cell of claim 13 further comprising a second electrical contact connected to said back surface.

21. The photodiode of claim 13 in which said first and third regions are lightly doped and said second region is heavily doped.

22. A tri-photodiode electrically responsive to incident light comprising:
    a first region of semiconductor material of a first conductivity type;
    a second region of semiconductor material of a second conductivity type opposite said first conductivity type extending over a portion of said first region;
    a third region of semiconductor material of said first conductivity type extending over at least portions of said first and second regions;
    a surface region of semiconductor material of said second conductivity type extending over a portion of said third region, said surface region for receiving light;
    a ring of semiconductor material of said second conductivity type extending from the second region to a surface of said third region, said ring surrounding but not contacting said surface region to isolate a first portion of said third region located within said ring from a second portion of the third region located outside of said ring;

a first electrical contact connected to said second portion of the third region;

a second electrical contact connected to said ring;

a third electrical contact connected to said first portion of the third region;

a fourth electrical contact connected to said surface region; and a substrate of the first conductivity type, said first region comprising a first epitaxial layer extending over said substrate, said third region comprising a second epitaxial layer, said substrate having greater conductivity than said first and second epitaxial layers.

23. A tri-photodiode electrically responsive to incident light comprising:

a first region of semiconductor material of a first conductivity type;

a second region of semiconductor material of a second conductivity type opposite said first conductivity type extending over a portion of said first region;

a third region of semiconductor material of said first conductivity type extending over at least portions of said and second regions;

a surface region of semiconductor material of said second conductivity type extending over a portion of said third region, said surface region for receiving light;

a ring of semiconductor material of said second conductivity type extending from the second region to a surface of said third region, said ring surrounding but not contacting said surface region to isolate a first portion of said third region located within said ring from a second portion of the third region located outside of said ring;

a first electrical contact connected to said second portion of the third region;

a second electrical contact connected to said ring;

a third electrical contact connected to said first portion of the third region;

a fourth electrical contact connected to said surface region; and a switch coupled to two of said electrical contacts.

24. A tri-photodiode electrically responsive to incident light comprising:

a first region of semiconductor material of a first conductivity type;

a second region of semiconductor material of a second conductivity type opposite said first conductivity type extending over a portion of said first region;

a third region of semiconductor material of said first conductivity type extending over at least portions of said first and second regions;

a surface region of semiconductor material of said second conductivity type extending over a portion of said third region, said surface region for receiving light;

a ring of semiconductor material of said second conductivity type extending from the second region to a surface of said third region, said ring surrounding but not contacting said surface region to isolate a first portion of said third region located within said ring from a second portion of the third region located outside of said ring;

a first electrical contact connected to said second portion of the third region;

a second electrical contact connected to said ring;

a third electrical contact connected to said first portion of the third region;

a fourth electrical contact connected to said surface region; and a first switch coupled to said first and third electrical contacts, a second switch coupled to said second and third electrical contacts, a third switch coupled to said third and fourth electrical contacts, and a fourth switch coupled to said second and fourth electrical contacts.

25. A tri-photodiode electrically responsive to incident light comprising:

a first region of semiconductor material of a first conductivity type;

a second region of semiconductor material of a second conductivity type opposite said first conductivity type extending over a portion of said first region;

a third region of semiconductor material of said first conductivity type extending over at least portions of said first and second regions;

a surface region of semiconductor material of said second conductivity type extending over a portion of said third region, said surface region for receiving light;

a ring of semiconductor material of said second conductivity type extending from the second region to a surface of said third region, said ring surrounding but not contacting said surface region to isolate a first portion of said third region located within said ring from a second portion of the third region located outside of said ring;

a first electrical contact connected to said second portion of the third region;

a second electrical contact connected to said ring;

a third electrical contact connected to said first portion of the third region;

a fourth electrical contact connected to said surface region; and a substrate of the first conductivity type, said first region extending over said substrate, said substrate having a conductivity greater than said first and third regions.

26. The tri-photodiode of claim 25 in which the first region, second region, third region, surface region, and ring comprise a photoconductive material selected from the group consisting of Si, Ge, ZnS, CdS, CdSe, GaAs, PbS, PbTe, InSb, InP, GaAlAs, AlAs, and PbSe.

27. The tri-photodiode of claim 25 in which the first conductivity type is p type and the second conductivity type is n type.

28. A tri-photodiode electrically responsive to incident light comprising:

a first region of semiconductor material of a first conductivity type;

a second region of semiconductor material of a second conductivity type opposite said first conductivity type extending over a portion of said first region;

a third region of semiconductor material of said first conductivity type extending over at least portions of said first and second regions;

a surface region of semiconductor material of said second conductivity type extending over a portion of said third region, said surface region for receiving light;

a ring of semiconductor material of said second conductivity type extending from the second region to a surface of said third region, said ring surrounding but not contacting said surface region to isolate a first portion of said third region located within said ring from a second portion of the third region located outside of said ring;

a first electrical contact connected to said second portion of the third region;

a second electrical contact connected to said ring;

a third electrical contact connected to said first portion of the third region; and a fourth electrical contact connected to said surface region; said first and third regions being lightly doped and said second region being heavily doped.

* * * * *